(12) United States Patent
Manabe et al.

(10) Patent No.: US 7,024,170 B2
(45) Date of Patent: Apr. 4, 2006

(54) FREQUENCY CONVERSION APPARATUS

(75) Inventors: Chitaka Manabe, Kobe (JP); Yoshito Fukumoto, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 444 days.

(21) Appl. No.: 10/289,096

(22) Filed: Nov. 7, 2002

(65) Prior Publication Data

US 2003/0092418 A1 May 15, 2003

(30) Foreign Application Priority Data

Nov. 12, 2001 (JP) .............................. 2001-345471

(51) Int. Cl.
*H04B 7/00* (2006.01)
(52) U.S. Cl. ...................... 455/260; 455/209; 455/316
(58) Field of Classification Search ................ 455/209, 455/76, 314, 315, 316, 317, 318, 257, 258, 455/259, 260, 323
See application file for complete search history.

(56) References Cited

U.S. PATENT DOCUMENTS

| | | | | |
|---|---|---|---|---|
| 5,390,346 | A * | 2/1995 | Marz | 455/260 |
| 5,608,724 | A | 3/1997 | Green, Jr. | |
| 5,847,612 | A * | 12/1998 | Birleson | 331/2 |
| 6,016,170 | A | 1/2000 | Takayama et al. | |
| 6,115,363 | A | 9/2000 | Oberhammer et al. | |
| 6,118,974 | A * | 9/2000 | Holliday et al. | 725/127 |
| 6,152,801 | A * | 11/2000 | Tsai | 446/470 |
| 6,163,684 | A * | 12/2000 | Birleson | 455/182.3 |
| 6,177,964 | B1 * | 1/2001 | Birleson et al. | 348/725 |
| 6,657,687 | B1 * | 12/2003 | Takizawa | 349/106 |
| 6,714,263 | B1 * | 3/2004 | Cowley | 348/731 |
| 6,725,463 | B1 * | 4/2004 | Birleson | 725/151 |
| 2002/0183033 | A1 * | 12/2002 | Gu et al. | 455/302 |

FOREIGN PATENT DOCUMENTS

| | | |
|---|---|---|
| DE | DE 197 31 480 A1 | 7/1997 |
| JP | 2000-299848 | 1/2000 |
| WO | WO 01/47261 A1 | 12/2000 |

\* cited by examiner

*Primary Examiner*—Nguyen T. Vo
*Assistant Examiner*—Nhan T. Le
(74) *Attorney, Agent, or Firm*—Reed Smith LLP; Stanley P. Fisher, Esq.; Juan Carlos A. Marquez, Esq.

(57) ABSTRACT

A plurality of frequency conversion sections is provided, each of which comprises a first frequency mixer for converting the frequency of the input frequency signal by a signal from a first oscillator; a first filter for extracting an element signal from the output signal of the first frequency mixer; a second frequency mixer for converting the frequency of the output signal from the first filter by a signal from a second oscillator; and a second filter for extracting a element signal from the output signal of the second frequency mixer. The respective frequencies of the first and second oscillators are determined in accordance with a predetermined frequency setting rule specified by the relationship between the frequency conversion sections. The element signals sequentially arranged in a predetermined frequency interval can be rearranged in a desired frequency interval within a desired frequency bandwidth.

6 Claims, 3 Drawing Sheets

FREQUENCY CONVERSION APPARATUS

BACKGROUND OF THE INVENTION

1. Field of the Invention

The present invention relates to a frequency conversion apparatus for converting the frequency of an outer input signal in which element signals having a predetermined frequency bandwidth are sequentially arranged in a predetermined frequency interval.

2. Description of the Related Art

Regarding a system for transmitting and processing signals including frequency components, a signal having a relatively high frequency is traditionally used in a wireless system, whereas a signal having a lower frequency is used in a wire system. Accordingly, as described in, for example, Japanese Unexamined Patent Application Publication No. 2000-299848 (Publication 1), a communication system in which a wireless communication is carried out in an access port to a terminal station of the respective homes or the like via a bi-directional CATV cable network, that is, a system including both a wireless system and a wire system requires the frequency conversion for the signals.

In the case of an outer input signal including a plurality of signals having a different frequency from each other, only a signal having a desired frequency is conventionally selected (extracted) from the input signal, and then generally processed after the frequency conversion.

FIG. 5 shows a block diagram of a heterodyne type frequency selection means, which is widely used in the conventional system. As shown in FIG. 5, the heterodyne type frequency selection means comprises an oscillator 52 for supplying a signal having a predetermined resonant frequency, a frequency mixer 51 and a filter 53, wherein a desired element signal can be selected (extracted) from an input signal in which signals (hereinafter being referred to as element signals) having a predetermined frequency bandwidth (which is not always fixed) are sequentially arranged in a predetermined frequency interval (the interval not always being fixed). In other words, an outer input signal (having a frequency fin) and an output signal (having a frequency fL) from the oscillator 52 are both input into said frequency mixer 51, and then the outer input signal is converted to a signal including two signals which have a frequency difference (|fin−fL|) and a frequency sum of (fin+fL) of the outer input signal and the output signal, respectively. Thereafter, the desired element signal is selected (extracted) from the signal thus converted by the filter 13 through which only the desired element signal is capable of passing. In this case, the frequency of the oscillator 52 is preset such that the desired element signal resides in the pass frequency bandwidth of the filter 13.

In Japanese Unexamined Patent Application Publication No. 9-93152 (Publication 2), a double conversion television tuner, in which a frequency conversion is made by means of the heterodyne type frequency selection means, has been disclosed. In this tuner, a desired channel signal is selected from a broadcasting signal including a plurality of channel signals (corresponding to said element signals), thereby allowing the frequency conversion to be made. A frequency conversion apparatus can be constituted by providing several double conversion television tuners (for example, the number of the tuners being the same as that of channels) to select channel signals different from each other, wherein signals having a higher frequency are initially converted to the signals having a lower frequency which can be processed with ease in a wire system, and then the signals thus converted are again converted into signals having an other higher frequency.

Since, however, there is a restriction for the frequency bandwidth used in the communication, it is desirable that the output signals after the frequency conversion have the element signals in a finer density (the frequency interval of the element frequencies being small or adjacent to each other) to reduce the total bandwidth of the frequency used. Any means for attaining such a requirement cannot be found in Publication 2.

SUMMARY OF THE INVENTION

In view of the above-mentioned problems, it is an object of the present invention to provide a frequency conversion apparatus, wherein element signals sequentially arranged in a predetermined frequency interval in an input signal are rearranged in a desired frequency interval within a desired frequency bandwidth.

To solve the above-mentioned problems, in accordance with the present invention, a frequency conversion apparatus for converting the frequency of an outer input signal in which element signals having a predetermined frequency bandwidth are sequentially arranged in a predetermined frequency interval, characterized in that said apparatus is equipped with a plurality of frequency conversion sections, each of said frequency conversion sections comprising: a first oscillator and a second oscillator both being capable of presetting the frequencies of signals output therefrom; a first frequency mixer for mixing the output signal of said first oscillator with said outer input signal to output a signal, the frequency of said signal being converted from the frequency of the outer input signal; a first filter for extracting a signal having a predetermined frequency bandwidth from the output signals of said first frequency mixer; and a second frequency mixer for mixing the output signal of said second oscillator with the output signal of said first filter to output a signal, the frequency of said signal being converted from the frequency of said first filter; whereby the respective frequencies of said first and second oscillators are determined in accordance with a predetermined frequency setting rule specified by the relationship between said frequency conversion sections, and the respective output signals from said second filters are synthesized to form an output signal.

It is also conceivable that a frequency conversion apparatus further comprises a frequency control section for determining the frequencies of the output signals from said first and second oscillators in accordance with said predetermined frequency setting rule.

Furthermore, it is also possible to provide a frequency conversion apparatus wherein the identification number of the respective frequency conversion sections is specified by i (0, 1, 2, . . . ); the identification number of the respective element signals is specified by j (0, 1, 2, . . . ); the output signals of said first and second oscillators in the i-th frequency conversion section is specified respectively by $fL1\_i$ and $fL2\_i$, the desired center frequency of the output signal of said second filter in the i-th frequency conversion section is specified by $fy\_i$; and the center frequency of the j-th element signal in said outer input signal is specified by $fx\_j$; whereby said predetermined frequency setting rule is expressed by the following equations:

$$fL1\_i = a + fx\_j,$$

$$fL2\_i = fy\_i - a,$$

where a is a predetermined constant.

Since the center frequency of the j-th element signal can be converted to the desired frequency fy_i, the element signals in the outer input signal can be rearranged in a desired order and in a predetermined frequency interval within the desired frequency bandwidth.

Furthermore, it is also possible to provide a frequency conversion apparatus, wherein in the case of the intervals Wx between the center frequencies of the respective element signals in said outer input signal being a fixed value, when a desired fixed interval between the center frequencies of the respective output signals from said second filters is specified by Wy; the identification number of said frequency conversion sections is specified by i (0, 1, 2, . . . ); and the output signals of said first and second oscillators in the i-th frequency conversion section is specified respectively by fL1_i and fL2_i, said predetermined frequency setting rule is expressed by the following equations:

$$fL1\_i = a1 + Wx \times i,$$

$$fL2\_i = a2 + Wy \times i,$$

where a1 and a2 are predetermined constants.

Accordingly, the element signals are sequentially rearranged with the desired frequency interval in the desired frequency range and in the same order as those in the outer input signal.

Moreover, it is also possible to rearrange the element signals so that the adjacent element signals are close to each other with little gap, when the frequency bandwidth of the respective element signals is a fixed value and the desired fixed interval between the center frequencies of the respective output signals from said second filters Wy is the same as the frequency bandwidth of said element signals.

As described above, in accordance with the present invention, the element signals sequentially arranged in a predetermined frequency interval can be rearranged in a desired frequency interval within a desired frequency bandwidth to provide a close and dense frequency interval, thereby making it possible to provide a communication with a high efficiency in the usage of the frequency bandwidth.

DETAILED DESCRIPTION OF THE PREFERRED EMBODIMENTS

In the following, referring to the accompanying drawings, embodiments of the invention will be described in order to understand the specific feature of the present invention. In this case, it is to be understood that the embodiments are given by way of example and therefore do not restrict the scope of the invention.

Figure 2:
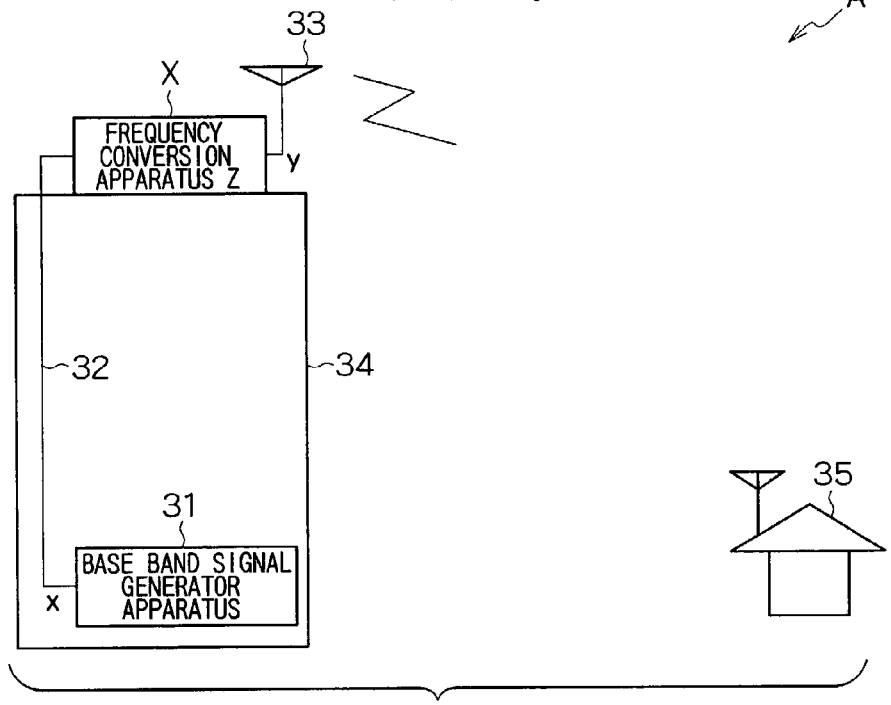
FIG. 2 is a conceptual diagram of a wireless data transmission system A including the frequency conversion apparatus Z according to the embodiment of the invention.
Figure 3:
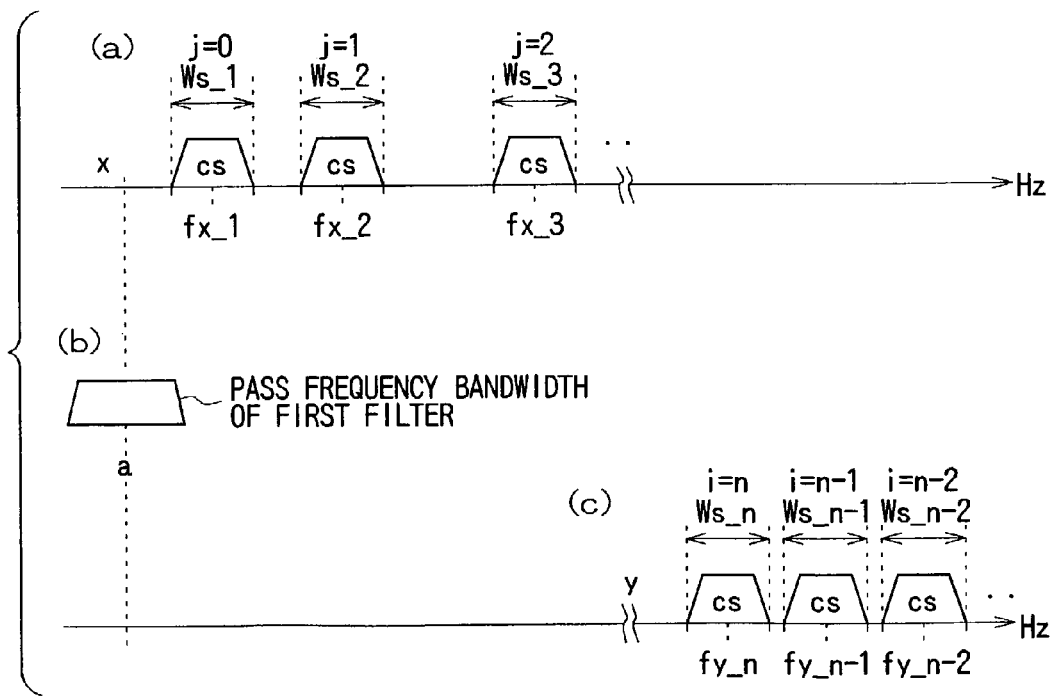
FIG. 3 illustrates diagrams showing an example of the frequency arrangement of channel signals in the input and output signals of the frequency conversion apparatus Z according to the embodiment of the invention.
Figure 4:
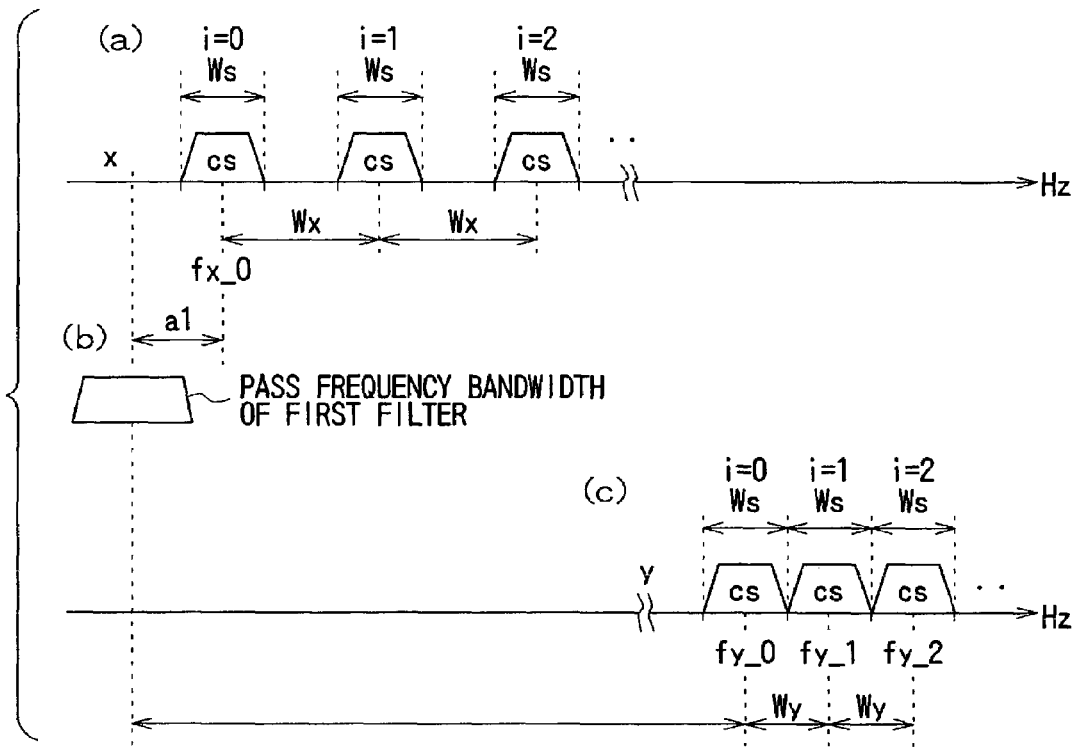
FIG. 4 illustrates diagrams showing an example of the frequency arrangement of channel signals in the input and output signals of a frequency conversion apparatus Z' according to an embodiment of the invention.
Figure 5:
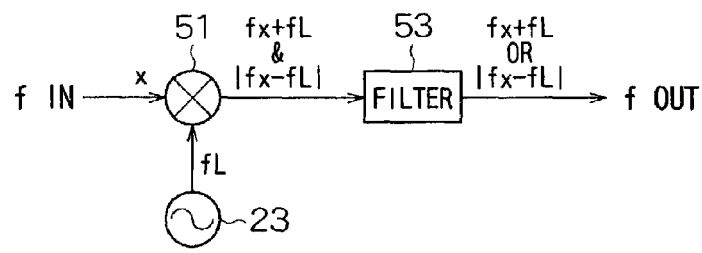
FIG. 5 is an arrangement of a conventional heterodyne type frequency selection means.

FIG. 1 illustrates block diagrams schematically showing a frequency conversion apparatus Z according to an embodiment of the invention. FIG. 2 is a conceptual diagram of a wireless data transmission system A including the frequency conversion apparatus Z according to the embodiment of the invention. FIG. 3 illustrates diagrams showing an example of the frequency arrangement of channel signals in the input and output signals of the frequency conversion apparatus Z according to the embodiment of the invention. FIG. 4 illustrates diagrams showing an example of the frequency arrangement of channel signals in the input and output signals of a frequency conversion apparatus Z' according to an embodiment of the invention. FIG. 5 is an arrangement of a conventional heterodyne type frequency selection means.

As shown in FIG. 2, the frequency conversion apparatus Z according to an embodiment of the invention is used on the side of a predetermined base station 34 in the wireless data transmission system A for transmitting a wireless frequency signal from the base station 34 to the terminal station 35.

The wireless data transmission system A comprises a base band signal generator 31 for generating a base band signal x in which channel signals (corresponding to the element signals) each having a predetermined frequency bandwidth for representing a transmitting data in a channel are arranged in a predetermined frequency interval (the interval not always having a fixed value); the frequency conversion apparatus Z for converting the base band signal x (corresponding to the outer input signal) thus generated into an output signal y having a high frequency for the wireless transmission; and an antenna 33 for outputting the output signal y from the frequency conversion apparatus Z as a wireless signal. The antenna 33 usually stands on a high ground to get obstacles out of the way between the antenna 33 and the terminal station 35 on the receiver side. A high frequency signal used for wireless transmission provides a considerable transmission loss, when it is used in a wire system. In view of this fact, the following circuit arrangement is usually employed: The base band signal generator 31 initially generates a low frequency signal x, and then the signal thus generated is transmitted to the antenna 33 via a signal cable 32, whose length is several hundred meters in a possible case. Thereafter, the low frequency signal is converted into a high frequency signal y by the frequency conversion apparatus Z. A provision of a signal cable 33 for each of the above-mentioned channel signals requires a high manufacturing cost and a large apace for implement. Accordingly, the channel signals cs are sequentially arranged in a predetermined frequency interval, as shown in FIG. 3(a), and thus a multi-channel signal can be transmitted via the single cable 32, thereby enabling the material resource to be saved (low cost) and the space to be reduced.

The base band signal generator 31 and the antenna 33 are well known in the art and therefore a further description thereof is omitted.

In the following, referring to FIG. 1, the circuit arrangement of the frequency conversion apparatus Z will be described.

Figure 1A:
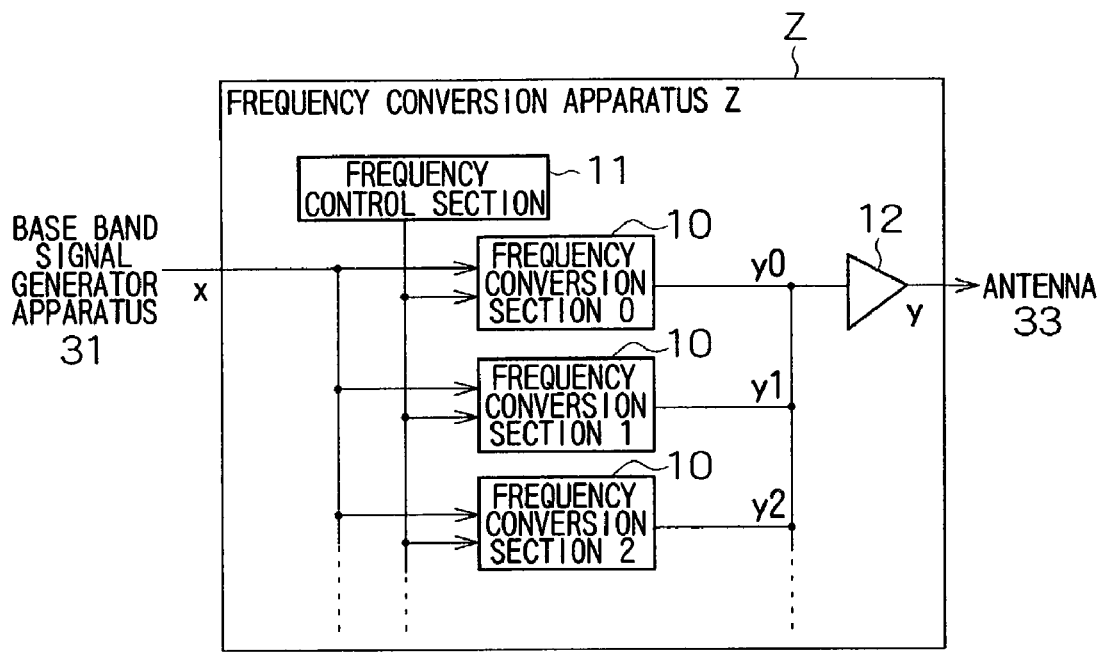
FIG. 1 illustrates block diagrams schematically showing a frequency conversion apparatus Z according to an embodiment of the invention.
Figure 1B:
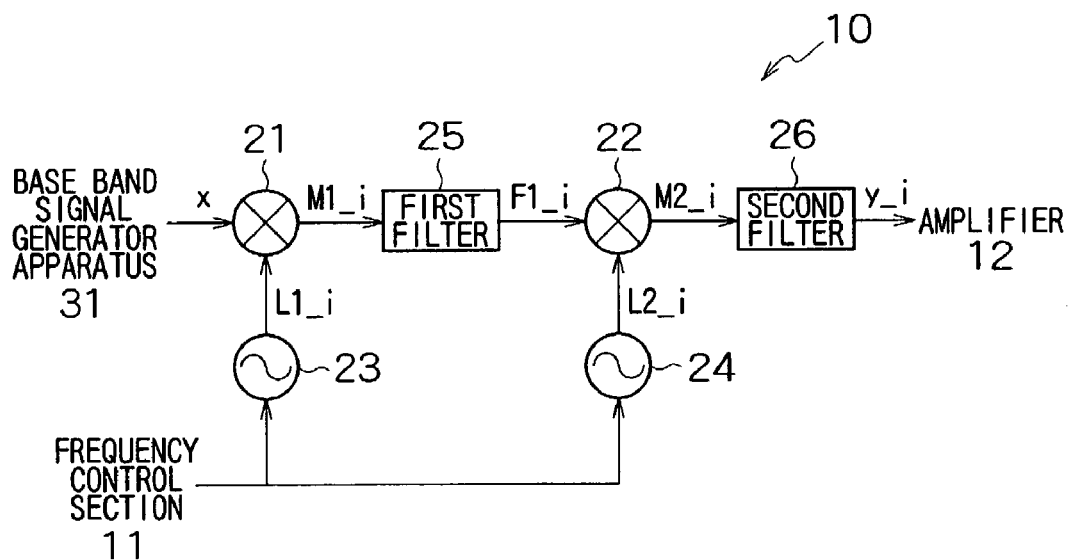

As shown in FIG. 1(a), the frequency conversion apparatus Z comprises a plurality of frequency conversion sections 10 for receiving the signal from the base band generator 31 to transform the frequency of the signal; a frequency control section 11 including memory units (not shown) consisting of CPU, ROM, a hard disk and the like for supplying a predetermined frequency setting signal to the frequency conversion sections 10 in accordance with a predetermined program; and an amplifier 12 for amplifying the signals converted by the frequency conversion sections 10. Moreover, as shown in FIG. 1(b), the frequency conversion section 10 comprises a first frequency mixer 21 and a second frequency mixer 22; a first oscillator 23 and a second oscillator 24 for supplying the respective frequency signals to the frequency mixers 23 and 24; and a first filter 25 and a second filter 26 for passing signal components each having a predetermined frequency bandwidth to extract from the respective output signal from the first and second frequency mixers 21, 22. In order to identify each of the frequency conversion sections 10, an identification number i (0, 1, 2, ... ) is introduced, and a symbol, to which mark "_i" is attached, means a corresponding element which pertains to the i-th frequency conversion section 10.

In the following, the main function of the frequency conversion apparatus Z will be described.

The base band signal x from the base band signal generator 31 and an output signal L1_i from the first oscillator 23 are both supplied to the first frequency mixer 21, and then the base band signal x is transformed therein into an output signal M1_i including a frequency sum and a frequency difference of the two input signals.

Moreover, the first filter 25, through which only a signal in a predetermined frequency bandwidth is capable of passing, extracts exclusively the frequency-converted channel signal F1_i from the output signal M1_i supplied from the frequency mixer 21.

Similarly, the channel signal F1_i extracted by the first filter 25 and an output signal L2_i from the second oscillator are both supplied to the second frequency mixer 22, and then is transformed therein into an output signal M2_i including a frequency sum and a frequency difference of the two input signals, in a similar manner to that in the first frequency mixer 21.

Subsequently, an output channel signal y_i, which is one of the frequency-converted channel signals, is extracted from the output signal M2_i supplied from the second frequency mixer 22 by the second filter 26. Thereafter, the respective output channel signal y_i to be output from the corresponding frequency conversion section 10 is produced. The output signals from the frequency conversion sections are synthesized to form an output signal. Then, the output signal is supplied to the antenna 33 via the amplifier 12.

The frequency conversion apparatus Z is characterized in that the frequency control section 11 determines the frequencies of the output signals L1_i, L2_i supplied respectively from the first and second oscillators 23, 24 on the basis of a predetermined rule for the frequency conversion sections 10, and thus the channel signals cs sequentially arranged in the base band signal x are transformed into signals each having a desired frequency and then rearranged in a desired order to form output signal y and finally supplied to the outside of the system.

In the following, the actual content of the frequency setting rules in the first and second oscillators 23, 24, which rules are determined by the frequency control section 11, will be described.

The symbols used herein are as follows: The identification number of the frequency conversion section 10 is i (0, 1, 2, ... ); the identification number of the channel signal cs is j (0, 1, 2, ... ); a desired center frequency of the output signal y_i from the second filter in the i-th frequency conversion section 10 is fy_i; the center frequency of the j-th element signal sequentially arranged in the base band signal x is fx_i; and the center frequency in the bandwidth, being capable of passing through the first filter 25, is a.

The frequency control section 11 determines the frequencies fL1_i and fL2_i of the first and second oscillators in the i-th frequency conversion section 10 as in the following equations (1):

$$fL1\_i = a + fx\_j$$

$$fL2\_i = fy\_i - a \quad (1)$$

In the following, the process of frequency-converting the base band signal x after determining frequencies fL1_i and fL2_i of the output signals from the first and second oscillators by the equations (1) will be described.

Regarding the j-th channel signal cs in the base band signal x, its center frequency fx_j is transformed in the output signal M1_i from the first mixer 21 into a frequency difference fM1_i(1) and a frequency sum fM1_i(2) of the output signal L1_i from the first oscillator and the center frequency fx_j, as described above. By utilizing the equation (1), the frequencies fM1_i(1) and fM1_i(2) can be expressed in the following equation (2):

$$fM1\_i(1) = a$$

$$fM1\_i(2) = a + 2 \times fx\_j \quad (2)$$

Regarding the frequency difference fM1_i(1), it follows that the center frequency of the j-th channel signal cs is converted to the center frequency a of the first filter 25. When, therefore, in all the frequency conversion sections 10, each first filter 25 is constituted by a band pass filter having a frequency bandwidth through which only one channel signal cs is capable of passing (that is, no adjacent channel signals can pass therethrough), as shown in FIG. 3(b), the output signal F1_i of the first filter 25 can be regarded as a j-th channel signal cs having a converted center frequency a. Moreover, in the output signal M2_i of the second frequency mixer 22, this center frequency of the j-th channel signal cs is converted into the frequency difference fM2_i(1) and frequency sum fM2_i(2), which can be expressed by the following equations (3):

$$fM2\_i(1) = |2 \times a - fy\_i|$$

$$fM2\_i(2) = fy\_i \quad (3)$$

From the equation (3), it follows that the two channel signals in the signal M2_i do not overlap each other, so long as the center frequency a of the frequency bandwidth for the first filter 25 is preset greater than half of the frequency bandwidth of the channel signal cs (a>Ws_i/2). In such a circuit arrangement, moreover, when the second filter 26 is constituted by a filter through which only j-th channel signal as whose center frequency is converted to the frequency sum fM2_i(2) passes (for instance, a bypass filter through which a signal having a frequency more than (fy_i-a) is capable of passing), the output signal fy_i of the second filter 26 becomes the j-th channel signal, whose center frequency is converted to a desired frequency fy_i.

Since the desired channel signal cs can be converted to a signal having a desired frequency (transformation fx_j→fy_i), an output signal y in which the channel signals cs sequentially arranged in the base band signal x are rearranged in a desired order together with a desired frequency can be obtained, so long as, in each of the frequency conversion sections 10, the identification number of the channel signals cs and the desired center frequency fy_i are both set in different values. FIG. 3(c) represents an example where the channel signals cs in the base band signal x shown in FIG. 3(a) are rearranged in reverse order.

In the following, a frequency conversion apparatus Z' will be described, where the channel signals cs in the base band signal x have the same frequency bandwidth Ws are arranged so as to have the same frequency interval Wx (>Ws), as shown in FIG. 4(a), and further the i-th frequency conversion section 10 extracts the i-th channel signal cs in the base band signal x and converts its frequency to supply an output signal y in which the channel signals cs arranged in the same as that in the initial base band signal x and in a desired fixed frequency interval Wy.

In the frequency conversion apparatus Z', frequencies fL1_i and fL2_i of the first and second oscillators in the i-th frequency conversion sections 10 are determined by the following equations (4):

$$fL1\_i = a1 + Wx \times i \quad (4)$$

$$fL2\_i = a2 + Wy \times i$$

where Wy is an interval or spacing between the center frequencies of the respective channel signals y_i supplied from the frequency conversion section 10, and a1 and a2 are predetermined constants.

In the following, the process of the frequency transformation in the determination of the frequencies fL1_i and fL2_i of the first and second oscillators by the equations (4) will be described.

In the base band signal x, the center frequencies are arranged in the same interval Wx, so that the center frequency fx_i of the i-th channel signal cs can be expressed by the following equation (5):

$$fx\_i = fx0 + Wx \times i \quad (5)$$

where fx0 is the center frequency of the 0-th channel signal cs.

In the i-th frequency conversion section 10, converted signals, in which the frequency of the base band signal x is converted to a frequency sum fM1_i(1) and a frequency difference fM1_i(2) of the output frequency fL1_i of the first oscillator 23 and the frequency of the base band signal x, are included in the output signal M1_i of the first frequency mixer 21. As a result, the center frequency of the i-th channel signal cs is converted to frequencies fM1_i(1) and fM1_i(2) which can be expressed by the following equations (6):

$$fM1\_i(1) = |fx\_i - fL1\_i| \quad (6)$$

$$fM1\_i(2) = fx\_i + fL1\_i$$

By substituting equations (4) and (5) into equation (6), the frequency difference fM1_i(1) can be obtained in the form of equation (7):

$$fM1\_i(1) = fx0 - a1 \quad (7)$$

When the constant a1 is determined such that (fx0−a1) is the center frequency of the pass frequency bandwidth of the first filter 25, as shown in FIG. 4(b), the i-th channel signal cs having the converted center frequency (fx0−a1) is output as the output signal F1_i of the first filter 25 in the i-th frequency conversion section 10.

Moreover, by the second frequency mixer 21, the frequency of the i-th channel signal F1_i extracted in the first filter 25 is converted to a frequency sum fM2_i(1) and a frequency difference fM2_i(2) as for the frequency fL2_i of the output signal from the second oscillator and the frequency of the signal F1_i. In other words, it follows that the i-th channel signal F1_i in the output signal M2_i from the second frequency mixer 21 includes two signals having the respective frequencies fM2_i(1) and fM2_i(2), which can be expressed by the following equations (8):

$$fM2\_i(1) = |fM1\_i(1) - fL2\_i| \quad (8)$$

$$fM2\_i(2) = fM1\_i(1) + fL2\_i$$

By substituting the equations (4) and (7) into the equations (8), the frequency difference fM2_i(1) and frequency sum fM2_i(2) can be obtained in the form of the following equations (9):

$$fM2\_i(1) = |-fx0 + a1 + a2 + Wy \times i| \quad (9)$$

$$fM2\_i(2) = fx0 - a1 + a2 + Wy \times i$$

When, therefore, the center frequency (fx0−a1) of the pass frequency bandwidth of the first filter 25 is set greater than half of the frequency bandwidth of the channel signal cs ((fx0−a1)>Ws/2), two different channel signals included in signal M2_i does not overlap each other in the same frequency bandwidth.

As a result, when the second filter 26 is constituted by a filter capable of passing only the channel signal cs having the converted frequency fM2_i(2), the central frequency fy_i of the output channel signal y_i can be expressed by the following equation:

$$fy\_i = fx0 - a1 + a2 + Wy \times i \quad (10)$$

From the equation (10), it can be recognized that the spacing between the center frequencies of the channel signals y_i output from the respective frequency conversion sections 10 is altered from the initial frequency interval Wx to the desired frequency interval Wy. When, moreover, the constant a2 is determined such that (fx0−a1 +a2) becomes the center frequency fy_0 of the output channel signal y_0 to be output from the 0-th frequency conversion section 10, as shown in FIG. 4(c), the channel signals cs rearranged in the same frequency interval Wy can be converted into those having the desired frequency bandwidth.

When, for example, the desired frequency interval Wy is the same as the frequency bandwidth Ws in the channel signals cs, the channel signals are arranged adjacent to each other in the desired frequency bandwidth, as shown in FIG. 4(c), and the frequency bandwidth occupied by the output signal can be minimized, thereby making it possible to provide a communication with a high efficiency in the usage of the frequency bandwidth.

The significance of converting the frequency in two steps in this invention is explained hereinafter. The frequency conversion in the first step is performed by the first oscillator, the first frequency mixer and the first filter. The frequency conversion in the second step is performed by the second oscillator, the second frequency mixer and the second filter.

The first step has a role to extract one channel signal among a lot of channel signals in an outer input signal. This invention deals mainly with an outer input signal which contains channel signals arranged with comparatively small frequency gap. In order to extract one channel signal from such an outer input signal, a filter with steep characteristic is necessary. The design and the manufacturing are difficult for such a filter and moreover are expensive. Therefore, preparing a filter with- different characteristic (the central frequency) for each frequency conversion section requires much labor for the design and the manufacturing, and moreover it increases cost. On the other hand, if it is possible to make all characteristics (the central frequency) of the first filter in each frequency conversion section identical, such a problem is substantially eased. In order to make the characteristic (the central frequency) of the first filter in each frequency conversion section identical, the frequency of the first oscillator in each frequency conversion section is set corresponding to the frequency of the input channel signal. In the above-mentioned two embodiments, the first filter has an identical central frequency in every frequency conversion section.

The second step has a role of converting each channel signal into the desired frequency band. Here, the second filter should have the function only to extract one signal from among the two signals which are contained in the output of the second mixer. Therefore, the characteristic which is as steep as the first filter is not required for the second filter. The characteristic (the central frequency) of the second filter must be changed for every frequency conversion section. However, because the required characteristic is comparatively not strict, there is not difficulty in designing and manufacturing the second filter with different characteristic for each frequency conversion section.

Theoretically, it is possible to convert in frequency and rearrange a lot of channel signals only in one step of frequency conversion. However, in case of such frequency conversion, it is difficult for practical use to design a filter for every channel signal and to manufacture it.

Moreover, in the construction of this invention, a system having flexibility can be built. In the first step of the frequency conversion, the central frequency of the output signal of the first filter is fixed. The conversion into the fixed frequency is performed in the first step by adjusting the frequency of the first oscillator corresponding to the entry signal. That is, even if the frequency of the entry signal to deal with is changed, the system can easily be adapted to it by changing the frequency of the output signal of the first oscillator. Next, the signal of the fixed frequency is converted into the desired frequency for each channel signal in the second step of the frequency conversion. Since the conversion in the second step is a conversion from the fixed frequency signal, this frequency conversion can be easily realized by setting the frequency of the output signals of the second oscillator according to each of the desired frequency. Moreover, the frequency setting rule for each of the second oscillators becomes simple. The system can rearrange each channel signal in the entry signal not only as in the row order (from low to high about the central frequency) in the entry signal, but also into the row order different from that in the entry signal, by setting the frequency of each of the output signals of the second oscillators. In this way, in the construction of this invention, the adaptation to the frequency of the entry signal and the setting with the high free degree of the output signal arrangement can be efficiently realized at the same time.

As described above, according to the construction of this invention, frequency conversion and rearrangement with high flexibility for the channel signals become possible while reducing labor and cost of the design and manufacturing.

We claim:

1. A frequency conversion apparatus for converting the frequency of an outer input signal in which element signals having a predetermined frequency bandwidth are sequentially arranged in a predetermined frequency interval, comprising:

frequency conversion sections of the same number as said element signals, each of said frequency conversion sections comprising:

a first oscillator and a second oscillator both being capable of presetting the frequencies of signals output therefrom;

a first frequency mixer for mixing the output signal of said first oscillator with said outer input signal to output a signal, the frequency of said signal being converted from the frequency of the outer input signal;

a first filter for extracting a signal having a predetermined frequency bandwidth from the output signals of said first frequency mixer;

a second frequency mixer for mixing the output signal of said second oscillator with the output signal of said first filter to output a signal, the frequency of said signal being converted from the frequency of the output signal of said first filter; and a second filter for extracting a signal having a predetermined frequency bandwidth from the output signals of said second frequency mixer; and a synthesizer for synthesizing the respective output signals from said frequency conversion sections to form an output signal, wherein the respective frequencies of said first and second oscillators are determined in accordance with a predetermined frequency setting rule specified by the relationship between said frequency conversion sections in conjunction with (1) a desired center frequency of the output signal of said second filter in a respective one of the frequency conversion sections and a center frequency of a respective one of the element signals in said outer input signal, or (2) a fixed interval between the center frequencies of the respective element signals in said outer input signal, and a desired fixed interval between the center frequencies of the respective output signals from said second filters.

2. The frequency conversion apparatus according to claim 1, further comprising a frequency control section for determining the frequencies of the output signals from said first and second oscillators in accordance with said predetermined frequency setting rule.

3. The frequency conversion apparatus according to claim 1, wherein the center frequency of the output signal of said first filter of each of said frequency conversion sections is identical.

4. A frequency conversion apparatus
for converting the frequency of an outer input signal in which element signals having a predetermined frequency bandwidth are sequentially arranged in a predetermined frequency interval, comprising:
frequency conversion sections of the same number as said element signals, each of said frequency conversion sections comprising:
a first oscillator and a second oscillator both being capable of presetting the frequencies of signals output therefrom;
a first frequency mixer for mixing the output signal of said first oscillator with said outer input signal to output a signal, the frequency of said signal being converted from the frequency of the outer input signal;
a first filter for extracting a signal having a predetermined frequency bandwidth from the output signals of said first frequency mixer;
a second frequency mixer for mixing the output signal of said second oscillator with the output signal of said first filter to output a signal, the frequency of said signal being converted from the frequency of the output signal of said first filter; and
a second filter for extracting a signal having a predetermined frequency bandwidth from the output signals of said second frequency mixer; and
a synthesizer for synthesizing the respective output signals from said frequency conversion sections to form an output signal,
wherein the respective frequencies of said first and second oscillators are determined in accordance with a predetermined frequency setting rule specified by the relationship between said frequency conversion sections,
wherein the center frequency of the output signal of said first filter of each of said frequency conversion sections is identical, and
wherein, when the identification number of said frequency conversion sections is specified by i (0, 1, 2, . . . ); the identification number said element signals is specified by j (0, 1, 2, . . . ) respectively; the output signals of said first and second oscillators in the i-th frequency conversion section is specified respectively by fL1_i and fL2_i, the desired center frequency of the output signal of said second filter in the i-th frequency conversion section is specified by fy_i; and the center frequency of the j-th element signal in said outer input signal is specified by fx_j,
said predetermined frequency setting rule is expressed by the following equations:

$$fL1\_i = a + fx\_j,$$

$$fL2\_i = fy\_i - a,$$

where a is a predetermined constant.

5. A frequency conversion apparatus
for converting the frequency of an outer input signal in which element signals having a predetermined frequency bandwidth are sequentially arranged in a predetermined frequency interval, comprising:
frequency conversion sections of the same number as said element signals, each of said frequency conversion sections comprising:
a first oscillator and a second oscillator both being capable of presetting the frequencies of signals output therefrom;
a first frequency mixer for mixing the output signal of said first oscillator with said outer input signal to output a signal, the frequency of said signal being converted from the frequency of the outer input signal;
a first filter for extracting a signal having a predetermined frequency bandwidth from the output signals of said first frequency mixer;
a second frequency mixer for mixing the output signal of said second oscillator with the output signal of said first filter to output a signal, the frequency of said signal being converted from the frequency of the output signal of said first filter; and
a second filter for extracting a signal having a predetermined frequency bandwidth from the output signals of said second frequency mixer; and
a synthesizer for synthesizing the respective output signals from said frequency conversion sections to form an output signal,
wherein the respective frequencies of said first and second oscillators are determined in accordance with a predetermined frequency setting rule specified by the relationship between said frequency conversion sections,
wherein the center frequency of the output signal of said first filter of each of said frequency conversion sections is identical, and
wherein, in the case of the intervals Wx between the center frequencies of the respective element signals in said outer input signal being a fixed value, and when a desired fixed interval between the center frequencies of the respective output signals from said second filters is specified by Wy; the identification number of said frequency conversion sections is specified by i (0, 1, 2, . . . ); and the output signals of said first and second oscillators in the i-th frequency conversion section is specified respectively by fL_i and fL2_i,
said predetermined frequency setting rule is expressed by the following equations:

$$fL1\_i = a1 + Wx \times i,$$

$$fL2\_i = a1 + Wy \times i,$$

where a1 and a2 are predetermined constants.

6. The frequency conversion apparatus according to claim 5, wherein the frequency bandwidth of the respective element signals is a fixed value, and wherein the desired fixed interval between the center frequencies of the respective output signals from said second filters is the same as the frequency bandwidth of said element signals.

* * * * *